United States Patent [19]

Matsuda

[11] Patent Number: 5,132,569
[45] Date of Patent: Jul. 21, 1992

[54] HIGH SPEED BI-COMS INPUT CIRCUIT FABRICATED FROM A SMALL NUMBER OF CIRCUIT COMPONENTS

[75] Inventor: Zensuke Matsuda, Tokyo, Japan
[73] Assignee: NEC Corporation, Tokyo, Japan
[21] Appl. No.: 613,039
[22] Filed: Nov. 15, 1990

[30] Foreign Application Priority Data
Nov. 15, 1989 [JP]  Japan ................. 1-298018

[51] Int. Cl.$^5$ .......................................... H03K 17/04
[52] U.S. Cl. ................................. 307/446; 307/475
[58] Field of Search .............. 307/443, 446, 473, 475, 307/570

[56] References Cited

U.S. PATENT DOCUMENTS

| | | | |
|---|---|---|---|
| 4,804,868 | 2/1989 | Masuda et al. | 307/570 X |
| 4,837,462 | 6/1989 | Watanabe et al. | 307/475 X |
| 4,849,658 | 7/1989 | Iwamura et al. | 307/446 |
| 4,933,574 | 6/1990 | Lien et al. | 307/446 |
| 4,999,517 | 3/1991 | Yamazaki | 307/446 |

*Primary Examiner*—David Hudspeth
*Attorney, Agent, or Firm*—Sughrue, Mion, Zinn, Macpeak & Seas

[57] ABSTRACT

An input circuit is responsive to a TTL-level input signal for producing a CMOS-level output signal and the complementary signal thereof and comprises a first inverter circuit implemented by a series combination of a p-channel type field effect transistor, a first output node and an n-p-n type bipolar transistor and responsive to the TTL-level input signal and a control signal opposite in phase to the input signal for producing the CMOS-level complementary output signal, a second inverter circuit implemented by a series combination of n-channel type field effect transistors and responsive to the input signal for producing the control signal, and a third inverter circuit implemented by a series combination of a p-channel type field effect transistor and an n-channel type field effect transistor and responsive to the CMOS-level complementary output signal for producing the CMOS-level output signal at a second output node, wherein the p-channel type field effect transistor of the first inverter circuit is enlarged without increasing the size of the bipolar transistor because a bipolar transistor is much larger in current driving capability than a field transistor, thereby achieving a high-speed operation.

1 Claim, 4 Drawing Sheets

HIGH SPEED BI-COMS INPUT CIRCUIT FABRICATED FROM A SMALL NUMBER OF CIRCUIT COMPONENTS

FIELD OF THE INVENTION

This invention relates to a high-speed input and, more particularly, to a high-speed input circuit implemented by a combination of bipolar transistors and CMOS inverters which is referred to as "Bi-CMOS circuit".

DESCRIPTION OF THE RELATED ART

An input circuit is incorporated in an integrated circuit for communication with an external device, and various circuit arrangements have been proposed. One of the high-speed input circuits is implemented by a Bi-CMOS circuit and shown in FIG. 1 of the drawings. The high-speed input circuit comprises a level shifter 1 implemented by a CMOS circuit or a series combination of a p-channel type field effect transistor QP1 and an n-channel type field effect transistor QN2 coupled between a power source Vcc and a ground node GND, two inverter circuits 2 and 3 coupled between the level shifter 1 and an inverted output node CDout, and a single inverter circuit 4 coupled between the level shifter 1 and a non-inverted output node Dout. A TTL-level input signal is supplied to an input node N1 of the level shifter 1, and the level shifter 1 changes the TTL-level input signal to a complementary signal of a CMOS level. The TTL-level input signal swings its voltage level between 0.4 volt and 2.4 volts, and the CMOS-level signal at the output node N2 ranges between zero volt and 5 volts. The voltage levels of 0.4 volt and zero volt are hereinbelow simply referred to as low voltage levels, and the voltage levels of 2.4 volts and 5 volts as high voltage levels.

Each of the three inverter circuits 2, 3 and 4 is a Bi-CMOS implementation and inverts the voltage level of a digital signal supplied to the input node N3, N4 or N5 thereof. In detail, the inverter circuit 2 comprises a series combination of a p-channel type field effect transistor QP3 and an n-channel type field effect transistor QN4 coupled between the power source Vcc and the ground node GND, a series combination of two n-channel type field effect transistors QN5 and QN6 coupled between an output node N6 and the ground node GND, and a series combination of two n-p-n bipolar transistors QB6 and QB7 coupled between the power source Vcc and the ground node GND, and the common drain nodes N7 and N8 of these series combinations are respectively coupled to the base nodes of the n-p-n bipolar transistors QB6 and QB7. The field effect transistors QP3, QN4 to QN6 form in combination a preamplifier stage for the n-p-n bipolar transistors QB6 and QB7. The inverter circuit 4 is similar in the circuit arrangement to the inverter circuit 2, and, for this reason, the component transistors and nodes of the inverter circuit 4 are designated by the same reference marks provided to the corresponding transistors and nodes of the inverter circuit 2. Since the p-channel type field effect transistors QP3 and the n-channel type field effect transistors QN4, QN5 and QN6 are gated by the input nodes N3 and N5 coupled to the output node N2, the level shifter 1 is expected to widely swing the voltage level at the output node N2 thereof in response to the relatively narrow TTL-level input signal. However, the n-channel type field effect transistor QN2 tends not to completely turn on because the TTL-level input signal does not exceed 2.4 volts. In order to cope with such an incomplete on-state of the n-channel type field effect transistor QN2, the n-channel type field effect transistor QN2 is designed to have a mutual conductance gm2 much larger than that of the p-channel type field effect transistor QP1, and, therefore, the output node N2 is allowed to reach the low voltage level within a relatively short time period in the presence of the TTL-level input signal at 2.4 volts.

The inverter circuit 3 comprises a series combination of a p-channel type field effect transistor QP8 and an n-channel type field effect transistor QN9 coupled between the power source Vcc and the ground node GND, a series combination of n-p-n bipolar transistors QB10 and QB11 coupled between the power source Vcc and the ground node GND, and a series combination of two n-channel type field effect transistors QN11 and QN12 coupled between the base node of the n-p-n bipolar transistor QB11 and the ground node GND. The field effect transistors QP8, QN9 and QN11 are gated by the input node N4 coupled to the output node N6, and the n-channel type field effect transistor QN12 is shifted between the on-state and the off-state depending upon the voltage level at a common drain node N9 of the transistors QP8 and QN9.

In operation, while the TTL-level input signal of the low voltage level or 0.4 volt is supplied to the input node N1, the level shifter 1 allows the output node N2 to remain in the high voltage level or about 5 volts supplied through the p-channel type field effect transistor QP1 of the onstate. The high voltage level at the output node N2 causes the p-channel type field effect transistor QP3 to turn off, and the n-channel type field effect transistors QN4 and QN5 simultaneously turn on. The common drain node N7 is discharged through the n-channel type field effect transistor QN4 to the ground node GND, and the n-p-n bipolar transistor QB6 turns off. The common drain node N7 thus discharged allows the n-channel type field effect transistor QN6 to turn off, and, for this reason, the positively accumulated output node N6 causes the n-p-n bipolar transistor QB7 to turn on. Then, the output node N6 is rapidly discharged to the ground node GND through both of the n-channel type field effect transistors QN5 and QN6 and the n-p-n bipolar transistor QB7. The output node N6 of the inverter circuit 4 thus discharged results in the output signal of the low voltage level at the non-inverted output node Dout. However, the output node N6 of the inverter circuit 2 allows the p-channel type field effect transistor QP8 to turn on, and the n-channel type field effect transistors QN9 and QN11 concurrently turn off. The common drain node N9 goes up to the high voltage level, and the n-p-n bipolar transistor QB10 and the n-channel type field effect transistor QN12 turn on. Even though the n-channel type field effect transistor QN12 is turned on, the n-channel type field effect transistor QN11 blocks the n-p-n bipolar transistor QB11 from the ground voltage level, and, for this reason, the inverted output node CDout is charged to the high voltage level through the n-p-n bipolar transistor QB10.

If the TTL-level input signal is shifted from the low voltage level at 0.4 volt to the high voltage level at 2.4 volts at time t1, the p-channel type field effect transistor QP1 turns off, and the n-channel type field effect transistor QN2 turns on so that the output node N2 is gradually discharged through the n-channel type field effect transistor QN2 to the ground node GND as indicated by plot N2 of FIG. 2. When the output node N2 reaches the threshold voltage level of the n-channel type field effect transistors QN4 and QN5, the n-channel type field effect transistors QN4 and QN5 turn off, but the p-channel type field effect transistor QP3 turns on to charge the common drain node N7. The common drain node N7 thus charged up allows the n-p-n bipolar transistor QB6 and the n-channel type field effect transistor QN6 to turn on The n-channel type field effect transistor QN6 supplies the ground voltage level to the base node of the n-p-n bipolar transistor QB7 and, accordingly, allows the n-p-n bipolar transistor QB7 to turn off. Then, the output node N6 goes up toward the high voltage level at 5 volts as indicated by plots Dout of FIG. 2. This results in the output signal of the high voltage level at the non-inverted output node Dout. The high voltage level at the node N6 of the inverter circuit 2 is relayed to the gate electrodes of the field effect transistors QP8, QN9 and QN11, and the n-channel type field effect transistors QN9 and QN11 turn on, but the p-channel type field effect transistor QP8 turns off. The common drain node N9 is discharged to the ground node GND, the n-channel type field effect transistor QN12 turns off so that the base node of the n-p-n bipolar transistor QB11 is isolated from the ground node GND. The common drain node N9 of the low voltage level allows the n-p-n bipolar transistor QB10 to turn off, and the complementary output signal of the low voltage level takes place at the inverted output node CDout as indicated by plots CDout of FIG. 2.

The input circuit thus arranged achieves a high speed operation by the aid of the Bi-CMOS circuits. However, a problem is encountered in the number of component transistors used for fabricating the prior art input circuit.

In detail, the n-channel type field effect transistor QN2 needs to have a larger mutual conductance than the p-channel type field effect transistor QP1 due to the input signal of the TTL-level as described hereinbefore. A mutual conductance of a field effect transistor is generally proportional to a channel width of the field effect transistor. The wider channel width a field effect transistor has, the larger parasitic capacitance the source/drain region couples with, and the large parasitic capacitance is causative of a small switching speed. In the level shifter 1, if the p-channel type field effect transistor QP1 is enlarged so as to increase the operation speed, the n-channel type field effect transistor needs to be much larger than the p-channel type field effect transistor QP1, and p-channel type field effect transistor QP1 consumes long time period for charging the large parasitic capacitance coupled to the source of the n-channel type field effect transistor QN2. In other words, the increased parasitic capacitance cancels out the increasing of the size of the p-channel type field effect transistor QP1, and large gate capacitances further retard the switching actions of the component field effect transistors QP1 and QN2. For this reason, any prominent improvement is hardly achieved by enlarging the component field effect transistors QP1 and QN2.

One of the approaches to faster operation is provision of the preamplifier stage associated with the series combination of the n-p-n bipolar transistors QB6 and QB7. The preamplifier stage amplify the output signal of the level shifter 1 and supplement the small current driving capability of the level shifter 1. However, the preamplifier stage is fabricated with four field effect transistors QP1 and QN4 to QN6, and a large number of the component transistors are necessary for the high-speed prior art input circuit.

SUMMARY OF THE INVENTION

It is therefore an important object of the present invention to provide an input circuit which is implemented by a small number of component transistors without any sacrifice of the operational speed.

To accomplish these objects, the present invention proposes to form an inverter circuit with a series combination of a field effect transistor and a bipolar transistor.

In accordance with the present invention, there is provided an input circuit responsive to an input signal for producing an output signal and a complementary output signal, the input signal swinging its voltage level in a first voltage range, the output signal and the complementary output signal swinging their voltage levels in a second voltage range different from the first voltage range, the input circuit comprising a) a first inverter circuit coupled between first and second sources of voltage level different in voltage level and implemented by a series combination of a field effect transistor, a first output node and a bipolar transistor, the field effect transistor and the bipolar transistor being responsive to the input signal at an input node and a control signal for producing the complementary output signal at the first output node through complementary switching actions, b) a second inverter circuit coupled between the first output node and the second source of voltage level and implemented by a series combination of field effect transistors, the field effect transistors of the second inverter circuit being responsive to the input signal and the complementary output signal for producing the control signal at a control node between the field effect transistors of the second inverter circuit, and c) a third inverter circuit coupled between the first and second sources of voltage level and implemented by a series combination of field effect transistors, the field effect transistors of the third inverter circuit being responsive to the complementary output signal for producing the output signal at a second output node.

BRIEF DESCRIPTION OF THE DRAWINGS

The features and advantages of a high-speed input circuit according to the present invention will be more clearly understood from the following description taken in conjunction with the accompanying drawings in which.

DESCRIPTION OF THE PREFERRED EMBODIMENTS

First Embodiment

Figure 1:
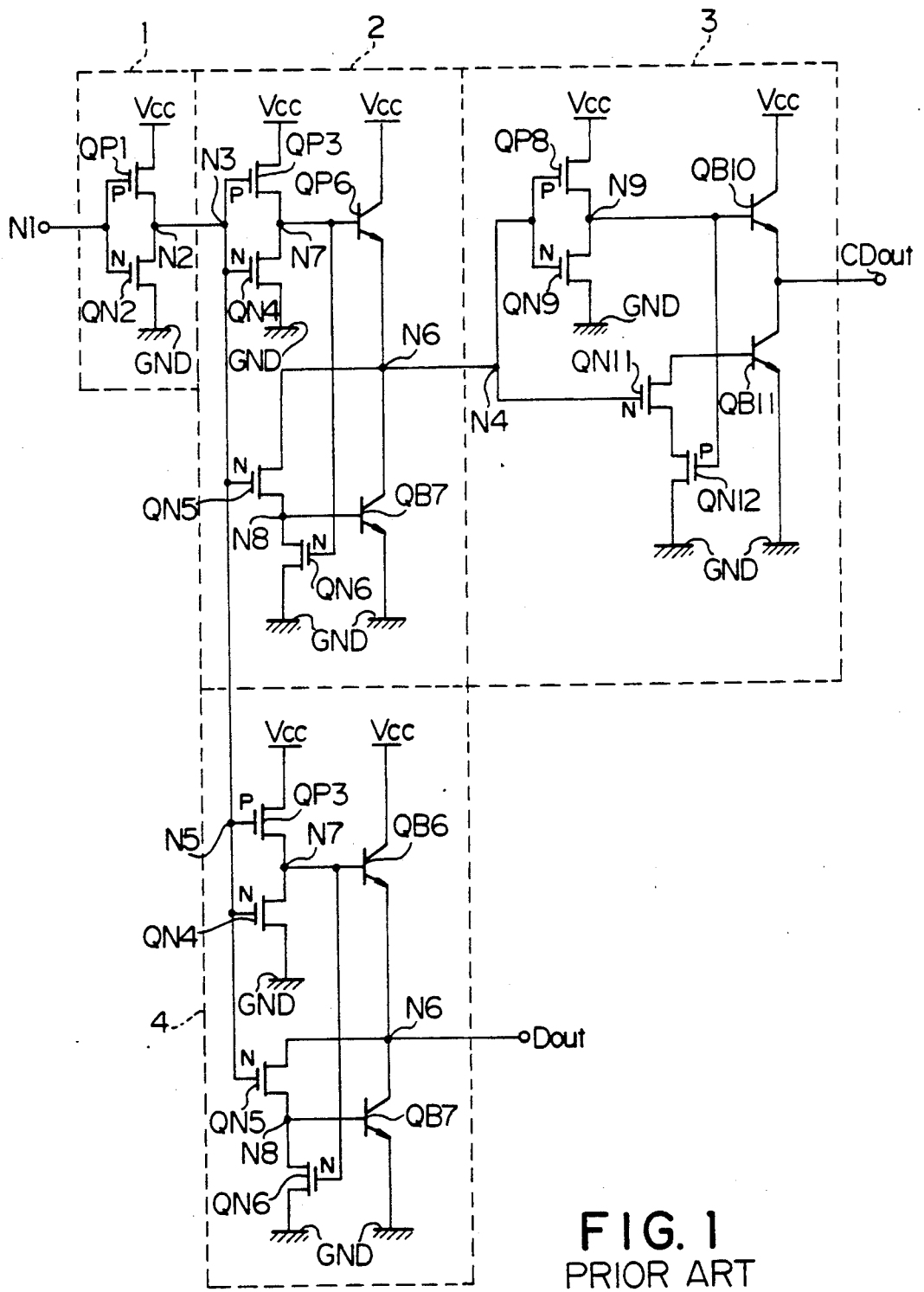
FIG. 1 is a circuit diagram showing the circuit arrangement of the prior art input circuit.
Figure 2:
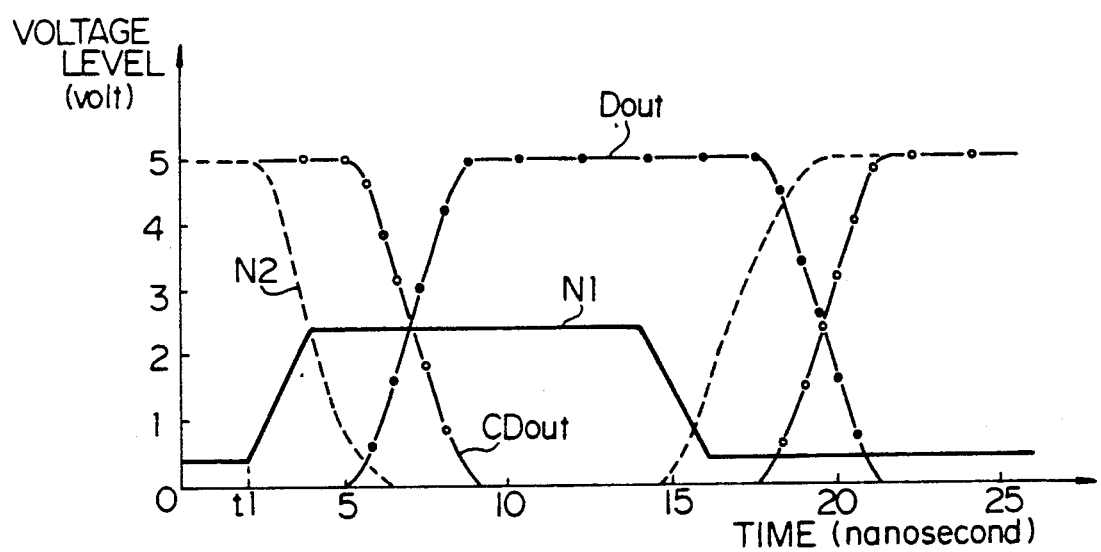
FIG. 2 is a diagram showing the waveforms of essential signals produced in the prior art input circuit.
Figure 3:
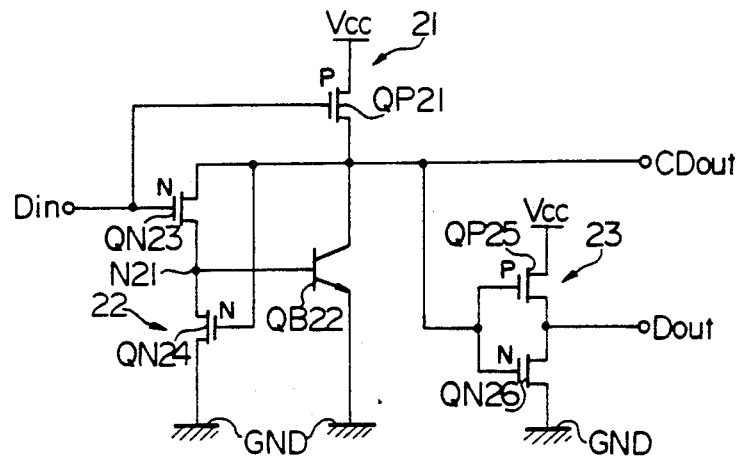
FIG. 3 is a circuit diagram showing the circuit arrangement of an input circuit according to the present invention.

Referring first to FIG. 3 of the drawings, an input circuit embodying the present invention comprises a first inverter circuit 21 implemented by a series combination of a p-channel type field effect transistor QP21 and an n-p-n type bipolar transistor QB22 coupled between a source of positive voltage level Vcc, a second inverter circuit 22 implemented by a series combination of n-channel type field effect transistors QN23 and QN24 coupled between an inverted output node CDout and the ground node GND, and a third inverter circuit 23 implemented by a series combination of a p-channel type field effect transistor QP25 and an n-channel type field effect transistor QN26 coupled between the source of positive voltage level Vcc and the ground node GND. An input node Din is coupled to the gate electrodes of the p-channel type field effect transistor QP21 and the n-channel type field effect transistor QN23, and a TTL-level input signal is supplied to the input node Din and, accordingly, to the gate electrodes of the field effect transistors QP21 and QN23. A control node N21 is provided between the n-channel type field effect transistors QN23 and QN24 and is coupled to the base node of the n-p-n bipolar transistor QB22. The second inverter circuit 22 produces a control signal at the control node N21, and the p-channel type field effect transistor QP21 and the n-p-n bipolar transistor QB22 are responsive to the TTL-level input signal and the control signal, respectively, so as to produce a CMOS-level complementary output signal at the inverted output node CDout. The inverted output node CDout is coupled to the gate electrodes of the field effect transistors QP25 and QN26, and the field effect transistors QP25 and QN26 are complementarily shifted between on-state and off-state to produce a CMOS-level output signal at the non-inverted output node Dout. In this instance, the TTL-level and the CMOS-level serve as first and second voltage ranges, respectively.

The p-channel type field effect transistor QP21 is enlarged with respect to the p-channel type field effect transistor used in the prior art input circuit, but the n-p-n bipolar transistor QB22 is similar in size to that of the prior art example. This is because of the fact that a small bipolar transistor is large enough in current driving capability to balance with a large field effect transistor.

Figure 4:
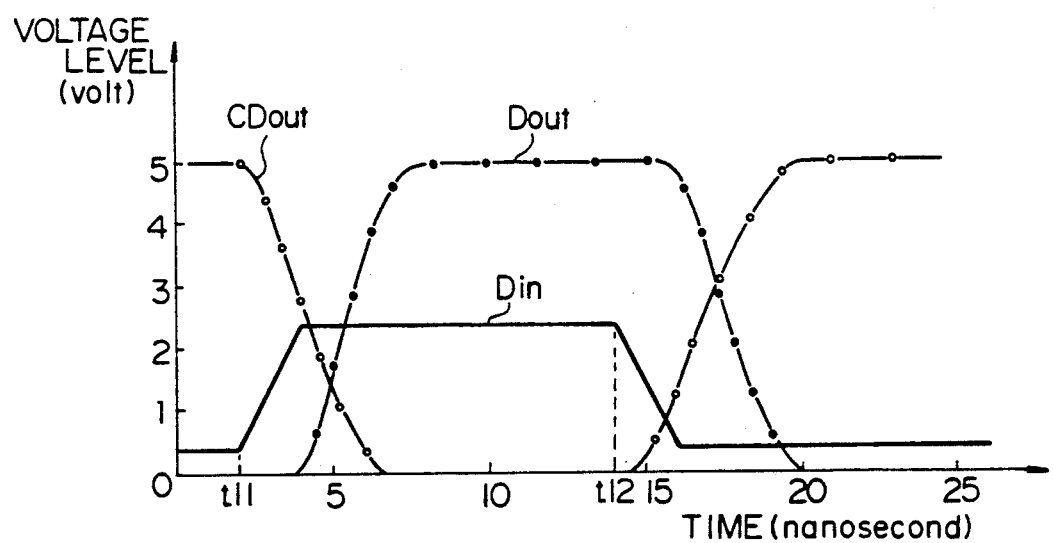
FIG. 4 is a diagram showing the waveforms of essential signals produced in the input circuit shown in FIG. 3.

Description is made on the circuit behavior of the input circuit with reference to FIG. 4 of the drawings. While the TTL-level input signal remains in the low voltage level, the p-channel type field effect transistor QP21 turns on to supply the positive high voltage level Vcc of about 5 volts to the inverted output node CDout. The input signal of the low voltage level blocks the control node N21 from the inverted output node CDout by the aid of the n-channel type field effect transistor QN23, but the inverted output node CDout allows the n-channel type field effect transistor QN24 to turn on. Then, the control node N21 is coupled through the n-channel type field effect transistor QN24 to the ground node GND, and the control signal of the low voltage level causes the n-p-n bipolar transistor QB22 to turn off. The complementary output signal of the high voltage level allows the n-channel type field effect transistor QN26 to turn on, but the p-channel type field effect transistor QP25 remains in the off-state. This results in the output signal of the low voltage level at the non-inverted output node Dout.

If the TTL-level input signal changes its voltage level from low voltage level at 0.4 volt to the high voltage level at 2.4 volts at time t11, the p-channel type field effect transistor QP21 is changed toward the offstate. The n-channel type field effect transistor QN23 turns on with the input signal of the high voltage level, and the positively charged inverted output node CDout allows the n-channel type field effect transistor QN24 and the n-p-n type field effect transistor QN24 to turn on. The inverted output node Dout is rapidly discharged through the n-p-n type bipolar transistor QB22 with a large current driving capability as well as the n-channel type field effect transistor QN24. When the inverted output node CDout goes down under the threshold voltage level of the n-channel type field effect transistor QN24, the n-channel type field effect transistor QN24 turns off, but the n-p-n type bipolar transistor QB22 continues to be turned on, thereby pulling down the inverted output node CDout. The complementary output signal of the low voltage level causes the third inverter circuit 23 to produce the output signal Dout of the high voltage level through the complementary switching actions of the field effect transistors QP25 and QN26.

The TTL-level input signal goes down to the low voltage level at time t12 again. The first inverter circuit 21 produces the complementary output signal of the high voltage level, and the third inverter circuit 23 produces the output signal of the low voltage level as described hereinbefore in connection with the initial condition of the input circuit.

Since a bipolar transistor is larger in current driving capability than a field effect transistor, the increment in size of the n-p-n type bipolar transistor QB22 is much smaller than that of the p-channel type field effect transistor QP21, which restricts the parasitic capacitance coupled to the collector of the n-p-n type bipolar transistor QB22. This is the first reason why the input circuit according to the present invention achieves a high speed operation in spite of the reduction of the component transistors.

Assuming now that the p-channel type field effect transistor QP1 is as wide in the channel width as 20 microns and that the n-channel type field effect transistor QN2 is five times larger in the channel width than the p-channel type field effect transistor, the parasitic capacitance of about 0.2 pF is coupled to the drain of the n-channel type field effect transistor QN2. However, a bipolar transistor with the base-emitter junction of about 6 micron is equivalent in current driving capability to the n-channel type field effect transistor QN2, and only 0.1 pF is coupled to the collector. Thus, the n-p-n type bipolar transistor QB22 coupled in series to the p-channel type field effect transistor QP21 is effective against deterioration of the operational speed of the input circuit.

Moreover, the n-p-n type bipolar transistor QB22 is controlled by the second inverter circuit 22, and the TTL-level input signal is not directly supplied to the base node of the n-p-n type bipolar transistor QB22. This means that the TTL-level input signal is free from the increment in the parasitic capacitance coupled to the base node of the n-p-n type bipolar transistor QB22, and the second inverter circuit 22 prevents the bipolar transistor QB22 from a low-speed switching action. However, the input circuit according to the present invention needs only one bipolar transistor QB22 and, accordingly, only one inverter circuit 22 serving as a preamplifier circuit. This results in reduction of the component transistors.

The input circuit shown in FIG. 3 is incorporated in an integrated circuit fabricated on a single semiconductor chip. However, the input circuit is useful for any electronic circuit implemented by discrete transistors.

Second Embodiment

Figure 5:
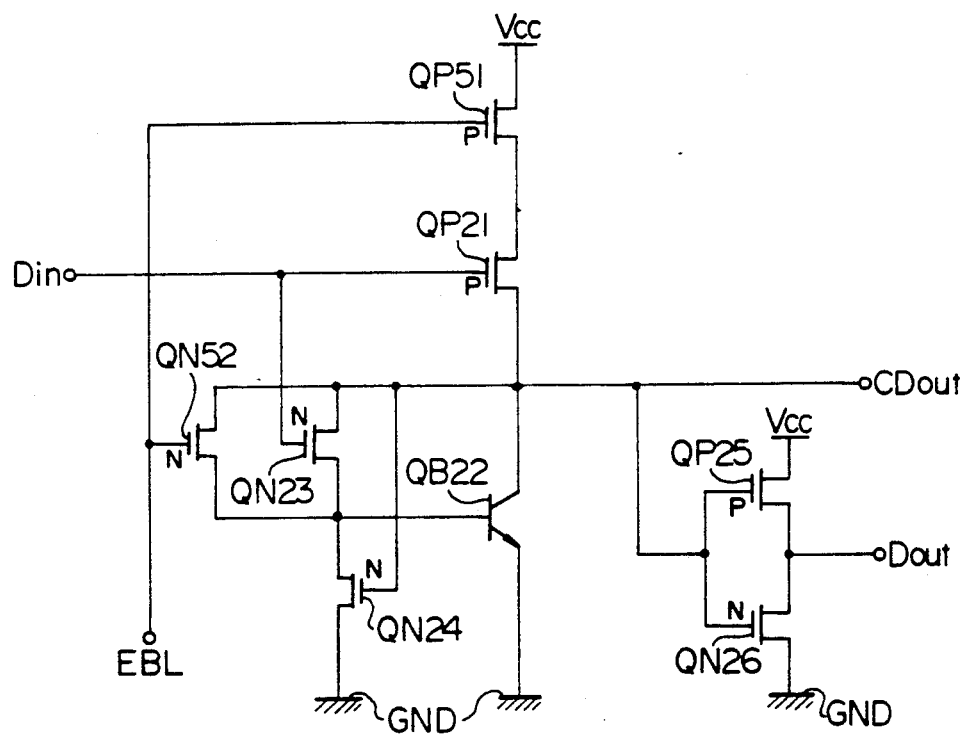
FIG. 5 is a diagram showing the circuit arrangement of an input circuit according to the present invention.

Turning to FIG. 5 of the drawings, another input circuit according to the present invention is illustrated. The input circuit shown in FIG. 5 is similar in circuit arrangement to the first embodiment except for first and second gate transistors QP51 and QN52, and, for this reason, corresponding transistors and nodes are designated by the same reference marks used in FIG. 3. The first gate transistor QP21 is coupled between the source of positive voltage level Vcc and the p-channel type field effect transistor QP21, and the second gate transistor QN52 is coupled between the collector node and the base node of the n-p-n bipolar transistor QB22. An enable signal EBL such as, for example, a chip select signal of an active low voltage level is supplied to the gate electrodes of the gate transistors QP51 and QN52 for activating the input circuit. However, if the enable signal EBL remains in the inactive high voltage level, the gate transistor QP51 blocks the input circuit from the source of positive voltage level Vcc, and previously charged inverted output node CDout allows the n-p-n type bipolar transistor QB22 to turn on because of the second gate transistor in the on-state.

While the enable signal EBL is shifted to the active low voltage level, the input circuit shown in FIG. 5 behaves as similar to the first embodiment, and no description on the circuit behavior is incorporated hereinbelow for the sake of simplicity.

Although particular embodiments of the present invention have been shown and described, it will be obvious to those skilled in the art that various changes and modifications may be made without departing from the spirit and scope of the present invention.

What is claimed is:

1. An input circuit responsive to an input signal for producing an output signal and a complementary output signal, said input signal swinging its voltage level in a first voltage range, said output signal and said complementary output signal swinging their voltage levels in a second voltage range different from said first voltage range, said input circuit comprising:

a) a first inverter circuit coupled between first and second sources of voltage level different in voltage level and implemented by a series combination of a field effect transistor, a first output node and a bipolar transistor, said field effect transistor and said bipolar transistor being responsive to said input signal at an input node and a control signal for producing said complementary output signal at said first output node through complementary switching actions, b) a second inverter circuit coupled between said first output node and said second source of voltage level and implemented by a series combination of field effect transistors, said field effect transistors of said second inverter circuit being responsive to said input signal and said complementary output signal for producing said control signal at a control node between said field effect transistors of said second inverter circuit, and c) a third inverter circuit coupled between said first and second sources of voltage level and implemented by a series combination of field effect transistors, said field effect transistors of said third inverter circuit being responsive to said complementary output signal for producing said output signal at a second output node, said field effect transistor of said first inverter circuit having a first channel conductivity type, said second inverter circuit comprising a series combination of two field effect transistors with a second channel conductivity type opposite to said first channel conductivity type, said two field effect transistors having respectively gate electrode coupled to said input node and said first output node, respectively, said third inverter circuit comprising a series combination of a field effect transistor of said first channel conductivity type and a field effect transistor of said second channel conductivity type gate electrodes of which are coupled to said first output node, said input circuit further comprising a first gate transistor of said first channel conductivity type coupled between said field effect transistor of said first inverter circuit and said first source of voltage level, and a second gate transistor coupled between said first output node and the base node of said bipolar transistor, said first and second gate transistors being responsive to an enable signal for activating said input circuit.

* * * * *